US010757851B2

(12) United States Patent
Teshima et al.

(10) Patent No.: US 10,757,851 B2
(45) Date of Patent: Aug. 25, 2020

(54) ELECTRONIC COMPONENT MOUNTER AND ELECTRONIC COMPONENT RELEASE METHOD

(71) Applicant: FUJI CORPORATION, Chiryu (JP)

(72) Inventors: Chikashi Teshima, Okazaki (JP); Hiromitsu Oka, Toyoake (JP); Kenichi Hayashi, Ichinomiya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/308,976

(22) PCT Filed: Jun. 14, 2016

(86) PCT No.: PCT/JP2016/067628
§ 371 (c)(1),
(2) Date: Dec. 11, 2018

(87) PCT Pub. No.: WO2017/216859
PCT Pub. Date: Dec. 21, 2017

(65) Prior Publication Data
US 2019/0230830 A1   Jul. 25, 2019

(51) Int. Cl.
*H05K 13/04*   (2006.01)
(52) U.S. Cl.
CPC .................. *H05K 13/0409* (2018.08)
(58) Field of Classification Search
CPC ............. H05K 13/0409; B25J 15/0675; B65G 47/917; B66C 1/0268
See application file for complete search history.

(56) References Cited

U.S. PATENT DOCUMENTS 6,152,283 A  *  11/2000  Kondo ............... B65G 47/1478
                                              198/380
6,662,438 B2 *  12/2003  Suhara ................ H05K 13/041
                                              29/743
(Continued)

FOREIGN PATENT DOCUMENTS

EP        1 542 524 A1    6/2005
JP        H8-66886 A      3/1996
(Continued)

OTHER PUBLICATIONS

International Search Report dated Sep. 6, 2016 in PCT/JP2016/067628 filed Jun. 14, 2016.

*Primary Examiner* — Stephen A Vu
(74) *Attorney, Agent, or Firm* — Oblon, McClelland, Maier & Neustadt, L.L.P.

(57) ABSTRACT

An electronic component mounter including a suction nozzle to pick up an electronic component housed in a housing section; a switching device configured to switch air supplied to a nozzle hole of the suction nozzle to negative pressure air when picking up the electronic component, and to switch the air supplied to the nozzle hole of the suction nozzle to positive pressure air when mounting the electronic component that was picked up by the suction nozzle on the circuit board; and a blow supply device configured to supply a first blow to the suction nozzle for a specified time when the positive pressure air is being supplied to the nozzle hole by a switching device. After the specified time has elapsed, stop the first blow and supply a second blow with a lower pressure than the first blow to the suction nozzle.

4 Claims, 4 Drawing Sheets

(56) References Cited

U.S. PATENT DOCUMENTS

| | | | |
|---|---|---|---|
| 2001/0049874 A1 | 12/2001 | Okuda et al. | |
| 2009/0031559 A1* | 2/2009 | Kawabata | H05K 13/0452 29/743 |
| 2010/0011570 A1* | 1/2010 | Kimura | H05K 13/041 29/743 |
| 2013/0078625 A1* | 3/2013 | Holmes | G01N 35/0092 435/6.11 |

FOREIGN PATENT DOCUMENTS

| | | |
|---|---|---|
| JP | 11-198079 A | 7/1999 |
| JP | 2002-79483 A | 3/2002 |
| JP | 2002-299891 A | 10/2002 |
| JP | 2006-147884 A | 6/2006 |
| JP | 2008-27986 A | 2/2008 |

* cited by examiner

ELECTRONIC COMPONENT MOUNTER AND ELECTRONIC COMPONENT RELEASE METHOD

TECHNICAL FIELD

The present application relates to an electronic component release method and an electronic component mounter provided with a suction nozzle configured to pick up an electronic component housed in a component housing section that houses multiple electronic components to be mounted on a circuit board.

BACKGROUND ART

In an electronic component mounter provided with a suction nozzle configured to pick up an electronic component, for example, an electronic component housed in a component housing section of carrier tape fed by a tape feeder is picked up by a suction nozzle using negative pressure and mounted at a specified position on a circuit board.

When the electronic component picked up by the suction nozzle is mounted on the circuit board, positive pressure air that acts as a vacuum break is supplied to the suction nozzle so as to return the pressure at the tip of the suction nozzle to atmospheric pressure, which releases the component from the suction nozzle. In this case, if the pressure of the air supplied to the suction nozzle is high, an electronic component just mounted on the circuit board or electronic components surrounding that position may be blown away, so the pressure of the air supplied to the suction nozzle is adjusted to be small.

Also, there are devices of this kind, such as disclosed in patent literature 1, provided with an air chamber of a specified volume for capturing air to be used for vacuum break in order to eliminate any differences in the state of the vacuum break due to the lengths of the piping paths between the suction nozzle and the positive and negative pressure switching electromagnetic valve, wherein air inside the air chamber is momentarily released when releasing the component from the suction nozzle.

CITATION LIST

Patent Literature

Patent literature 1: JP-A-2002-299891

BRIEF SUMMARY

Technical Problem

However, with a device that supplies low pressure air, there is a problem in that the time required for the vacuum break is long, which limits improvements to the working efficiency of the electronic component mounter. Also, with the device disclosed in patent literature 1, it is necessary to provide an air chamber for collecting an amount of air in accordance with the piping paths between the suction nozzle and the negative and positive pressure switching electromagnetic valve. Therefore, depending on the type, size, and the like of the electronic component mounter, an air chamber with a different volume is required and, because this does not control the air pressure, it is difficult to achieve an adequate vacuum break effect.

The present disclosure takes account of the above problems and an object thereof is to provide an electronic component mounter and electronic component release method that reliably achieves a vacuum break in a short time.

Solution to Problem

To solve the above problems, an electronic component mounter of the present disclosure includes: a suction nozzle configured to pick up an electronic component housed in a housing section that houses multiple of the electronic components that are to be mounted on a circuit board; a switching device configured to switch air supplied to a nozzle hole of the suction nozzle to negative pressure air when picking up the electronic component, and to switch the air supplied to the nozzle hole of the suction nozzle to positive pressure air when mounting the electronic component that was picked up by the suction nozzle on the circuit board; and a blow supply device configured to supply at least a first blow to the suction nozzle for a specified time when the positive pressure air is being supplied to the nozzle hole by the switching device, then, after the specified time has elapsed, stop the first blow and supply a second blow with a lower pressure than the first blow to the suction nozzle.

Advantageous Effects

According to the present disclosure, when mounting an electronic component picked up by a suction nozzle on a circuit board, at least a first blow is supplied to the suction nozzle for a specified time, then, after the specified time has elapsed, the first blow is stopped and a second blow with a lower pressure than the first blow is supplied to the suction nozzle; therefore, it is possible to break the vacuum reliably in a short time. Further, it is possible to curtail cases of the electronic component that has just been mounted on the circuit board and surrounding electronic components being blown away.

DESCRIPTION OF EMBODIMENTS

Figure 1:
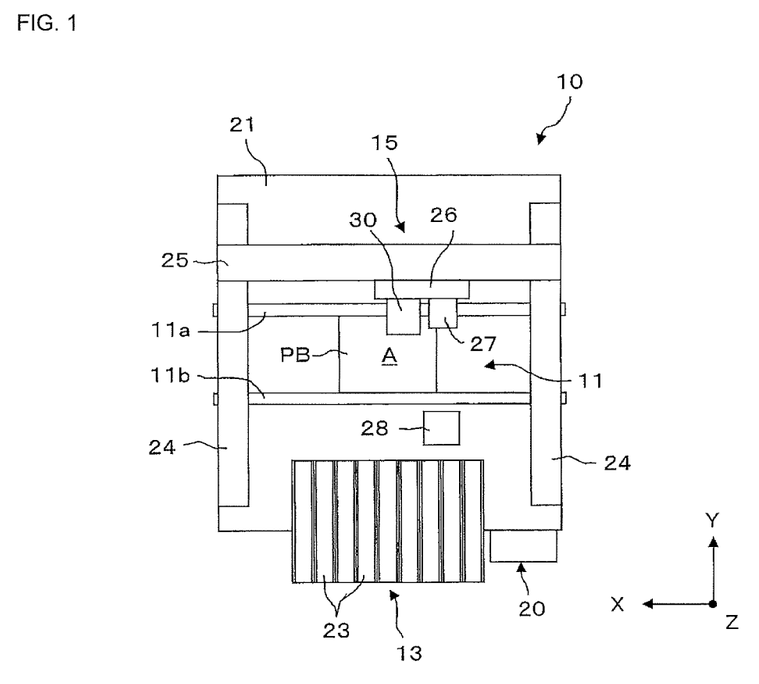
FIG. 1 is a plan view of an electronic component mounter of an embodiment of the present disclosure.

Embodiments of the present disclosure are described below with reference to the figures. As shown in FIG. 1, electronic component mounter 10 that is an embodiment of the present disclosure is provided with: board conveyance device 11 that is arranged on base 21 and is configured to convey circuit board PB; component supply device 13 that is arranged along board conveyance device 11 and is configured to supply electronic components to be mounted on circuit board PB; component mounting device 15 that is arranged above base 21 and is configured to pick up electronic components supplied by component supply device 13, transport them above circuit board PB, and mount them; and controller 20 that is configured to control board conveyance device 11, component supply device 13, component mounting device 15, and the like. In descriptions below, the conveyance direction of circuit board PB is referred to as the X-axis direction, a direction horizontally perpendicular to the X axis is referred to as the Y-axis direction, and the vertical direction perpendicular to the X axis and the Y axis is referred to as the Z-axis direction.

Board conveyance device 11 conveys circuit board PB to component mounting position A and clamps it, and after electronic components have been mounted on the circuit board PB, conveys it from component mounting position A. Board conveyance device 11 is configured from items such as a pair of conveyor belts (not shown) that convey circuit board PB along pair of guide rails 11a and 11b.

Component supply device 13, for example, is configured from multiple tape feeders 23 on which carrier tape is loaded in a feedable manner, the carrier tape housing multiple electronic components in component housing sections at regular intervals, and the multiple tape feeders 23 are removably lined up in the X-axis direction on base 21.

Component mounting device 15 is configured from a robot capable of moving horizontally in the X-axis direction and the Y-axis direction. Component mounting device 15 is provided with: pair of rails 24 extending in the Y-axis direction; Y-axis slider 25 movably supported in the Y-axis direction on the pair of rails 24; X axis slider 26 movably supported in the X axis direction on Y-axis slider 25; and mounting head 30 attached to X axis slider 26.

Y-axis slider 25 is driven via a ball screw mechanism by a Y-axis drive motor, not shown, provided on rails 24, and X-axis slider 26 is driven via a ball screw mechanism by an X-axis drive motor, not shown, provided on Y-axis slider 25.

Board recognition camera 27 is attached to X axis slider 26, and board recognition camera 27 images reference marks and the like provided on circuit board PB positioned at component mounting position A, and acquires board position reference information and the like. Also, component recognition camera 28 is provided on base 21 between board conveyance device 11 and component supply device 13, and component recognition camera 28 images an electronic component picked up by suction nozzle 35 and acquires the XY direction and the θ-axis rotation position deviation amount of the electronic component with respect to suction nozzle 35.

Figure 2:
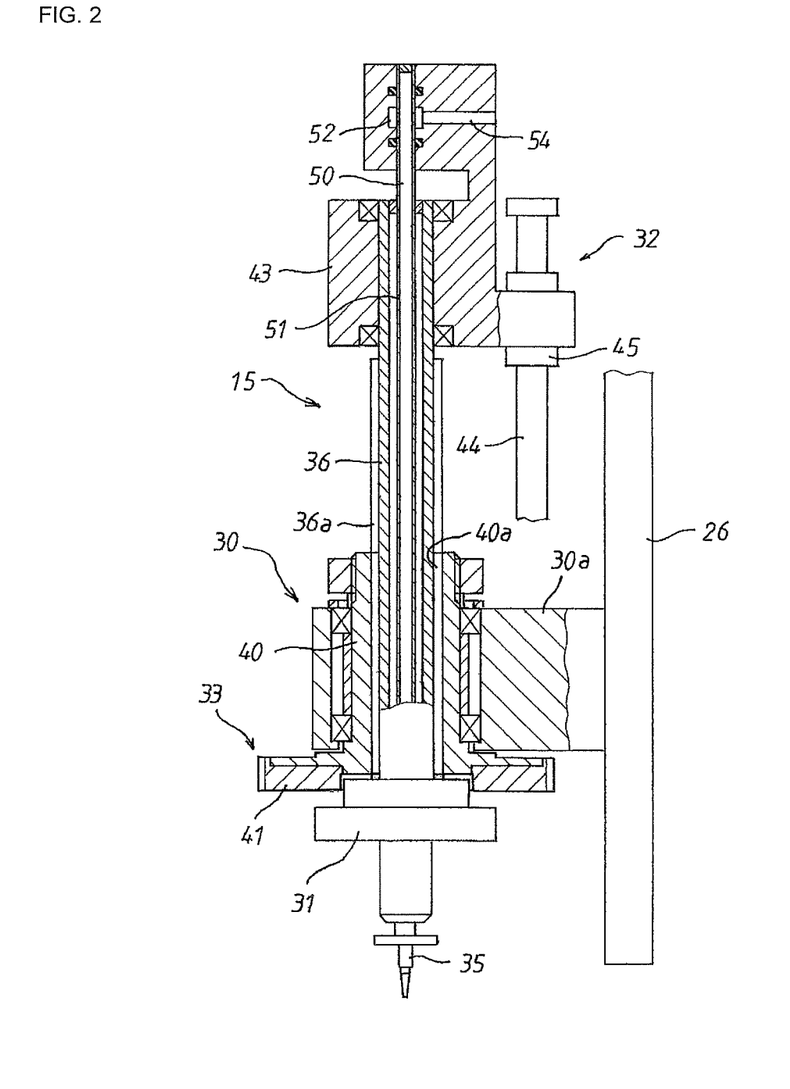
FIG. 2 is a cross section of a component mounting device of the electronic component mounter.

As shown in FIG. 2, component mounting device 15 is provided with items such as: main body 30a of mounting head 30 attached to X-axis slider 26; cylindrical rotation body 40 supported on main body 30a to rotate only around a θ-axis line parallel to the Z axis; nozzle holding body 31 supported on rotation body 40 to be raisable and lowerable only along the Z axis; raising and lowering device 32 for raising and lowering nozzle holding body 31; and rotating device 33 for rotating nozzle holding body 31. Suction nozzle 35 that picks up and holds electronic component P (refer to FIG. 4) using suction is held on a lower end of nozzle holding body 31, and nozzle hole 35a (refer to FIG. 4) to which positive pressure air and negative pressure air, described later, are supplied is provided at the tip of suction nozzle 35.

Cylindrical shaft section 36 extending upwards is provided at the upper end of nozzle holding body 31, and spline section 36a is formed on an outer circumference of shaft section 36. Spline section 36a formed on shaft section 36 of nozzle holding body 31 is engaged with spline hole 40a formed on an inner circumference of rotation body 40 such that only sliding is possible.

The lower end of rotation body 40 protrudes down from main body 30a of mounting head 30 and gear 41 is fixed to that protruding end. Gear 41 is rotated by a rotation motor, not shown, that is a drive source for rotation device 33, such that rotation body 40 and nozzle holding body 31 that is holding suction nozzle 35 rotate around the θ-axis line.

Raising and lowering device 32 is configured from: raising and lowering member 43 supported on main body 30a of mounting head 30 in a raisable and lowerable manner; ball screw 44 provided on main body 30a to be rotatable only around an axis line parallel to the Z axis; ball nut 45 fixed to raising and lowering member 43 and engaged with ball screw 44; and a raising and lowering motor, not shown, for rotating ball screw 44. An upper portion of shaft section 36 of nozzle holding body 31 is held such that relative rotation with raising and lowering member 43 is allowed while relatively movement in the axis direction is not possible, and by ball screw 44 being rotated by the raising and lowering motor that is not shown, raising and lowering member 43 and nozzle holding body 31 are raised and lowered.

Figure 3:
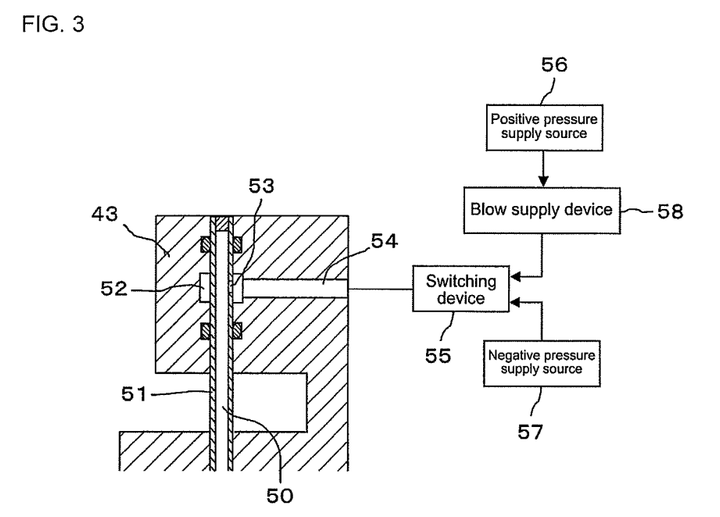
FIG. 3 shows a positive pressure supply source and a negative pressure supply source.

Pipeline 51 formed with passage 50 for positive pressure supply and negative pressure supply pierces through a center portion of shaft section 36 of nozzle holding body 31, and passage 50 formed in pipeline 51 is connected to nozzle hole 35a of suction nozzle 35. The upper end of pipeline 51 is engaged with raising and lowering member 43 such that relative rotation only is allowed, and the upper end of passage 50 is blocked. As shown in FIG. 3, diameter direction passage 53, which opens onto ring channel 52 formed in raising and lowering member 43, is formed in pipeline 51, and diameter direction passage 53 is connected to supply passage 54 formed in raising and lowering member 43.

Positive pressure supply source 56 such as a compressor and negative pressure supply source such as a vacuum pump are connected via switching device 55 to supply passage 54, and by these positive pressure air or negative pressure air is introduced to pipeline 51 via ring channel 52 and diameter direction passage 53.

Switching device 55 is switched based on commands from controller 20, and when suction nozzle 35 picks up an electronic component P, switching device 55 is switched such that supply passage 54 is connected to negative pressure supply source 57, and when the picked up component P is released from suction nozzle 35, switching device 55 is switched such that supply passage 54 is connected to positive pressure supply source 56.

Figure 4:
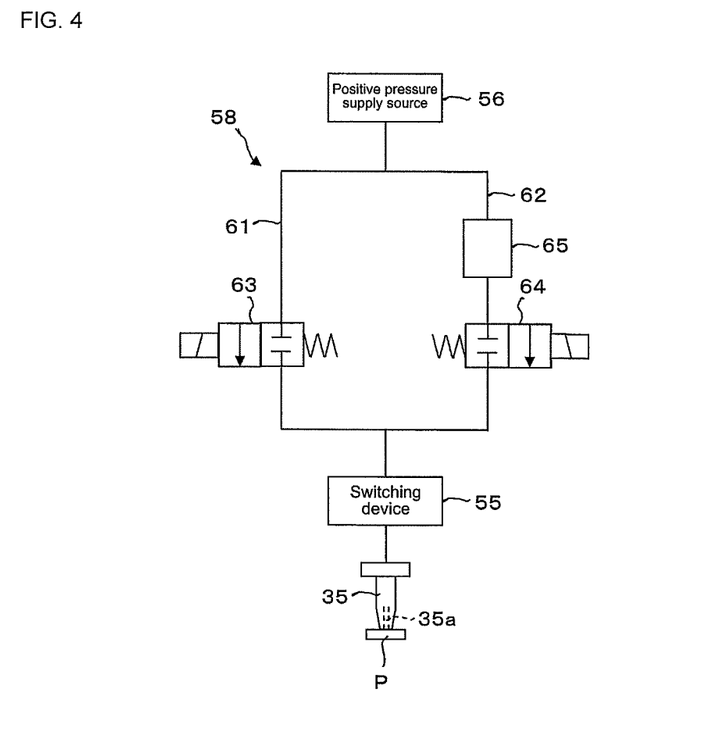
FIG. 4 is an air path diagram of a blow supply device.

Blow supply device 58 is provided between switching device 55 and positive pressure supply source 56, and the air pressure of the positive pressure supplied to pipeline 51 via supply passage 54, that is, the pressure of the blow ejected from the tip of suction nozzle 35, can be adjusted by blow supply device 58. In other words, as shown in FIG. 4, blow supply device 58 is provided with first blow supply passage 61 and second blow supply passage 62 connected in parallel, and an end of each of first blow supply passage 61 and second blow supply passage 62 is connected to positive pressure supply source 56. Also, the other end of each of first blow supply passage 61 and second blow supply passage 62 is connected to suction nozzle 35 via switching device 55.

First opening and closing valve 63 for allowing the first blow to pass is provided inside first blow supply passage 61, and second opening and closing valve 64 for allowing a second blow that has a lower pressure than the first blow to pass is provided inside second blow supply passage 62. These first opening and closing valve 63 and second opening and closing valve 64 are each configured from an electromagnetic switching valve capable of opening and closing.

Further, regulator 65 that reduces the pressure supplied from positive pressure supply source 56 is provided on second blow supply passage 62 upstream of second opening and closing valve 64, that is, between second opening and closing valve 64 and positive pressure supply source 56. By this, the pressure of the second blow is reduced by regulator 65 so as to maintain a lower pressure than that of the first blow.

By this, when first opening and closing valve 63 is switched to the open side, the original pressure supplied by positive pressure supply source 56, that is, relatively high positive pressure air, is ejected from nozzle hole 35a of suction nozzle 35 via first blow supply passage 61. On the other hand, when second opening and closing valve 64 is switched to the open side, lower pressure positive pressure air the pressure of which was reduced by regulator 65 is ejected from nozzle hole 35a of suction nozzle 35 via the second blow supply passage 62.

The above switching device 55 and first and second opening and closing valves 63 and 64 of blow supply device 58 are controlled and switched based on signals from controller 20 issued in accordance with a control cycle of electronic component mounter 10.

Operation of electronic component mounter 10 with the configuration above is described next. Mounting head 30 of component mounting device 15 is moved in the X-axis and Y-axis directions by X-axis and Y-axis drive motors, which are not shown, such that suction nozzle 35 is moved above component supply device 13. When suction nozzle 35 has been positioned above an electronic component P fed to a specified position at tape feeder 23, switching device 55 is switched based on commands from controller 20 such that supply passage 54 is connected to negative pressure supply source 57 so that negative pressure is supplied to nozzle hole 35a of suction nozzle 35. In this state, when nozzle holding body 31 is lowered by a specified amount by raising and lowering device 32, suction nozzle 35 contacts the upper surface of the electronic component P to be picked up, and the electronic component P is picked up and held on the tip of the suction nozzle 35 by the negative pressure.

After the electronic component P has been picked up by suction nozzle 35, nozzle holding body 31 is raised by raising and lowering device 32, and mounting head 30 is moved towards circuit board PB that is positioned at component mounting position A. While being moved, the electronic component P picked up by suction nozzle 35 is imaged by component recognition camera 28, and the pickup position deviation of the electronic component P held by suction nozzle 35 is detected. The positional deviations in the X-axis and Y-axis directions are corrected by the X axis and Y axis movement of mounting head 30, and rotational deviation is corrected by rotation of nozzle holding body 31 by rotation device 33. Then, when mounting head 30 is moved to the decided position above circuit board PB, nozzle holding body 31 is lowered such that the electronic component P held by suction nozzle 35 is mounted at the specified position on circuit board PB.

Here, switching device 55 is switched based on commands from controller 20 such that supply passage 54 is connected to positive pressure supply source 56 so that negative pressure is no longer supplied to nozzle hole 35a of suction nozzle 35. At the same time, based on commands from controller 20, first and second opening and closing valves 63 and 64 of blow supply device 58 are switched such that positive pressure supply source 56 and supply passage 54 are respectively connected via first blow supply passage 61 and second blow supply passage 62.

By this, first blow (original air pressure) is supplied to suction nozzle 35 from positive pressure supply source 56 via first blow supply passage 61, switching device 55, supply passage 54, and flow passage 50, to be ejected from the tip of nozzle hole 35a. At the same time, second blow is supplied to suction nozzle 35 from positive pressure supply source 56 via second blow supply passage 62, switching device 55, supply passage 54, and flow passage 50, to be ejected from the tip of nozzle hole 35a.

Figure 5:
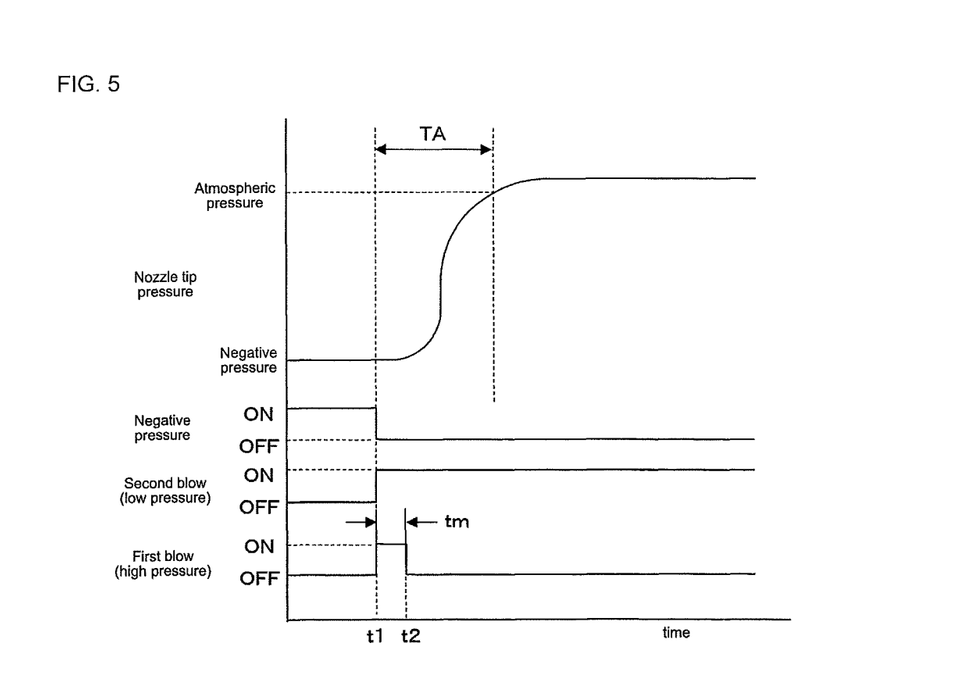
FIG. 5 is a graph showing pressure characteristics at the tip of a suction nozzle as controlled by the blow supply device.

In other words, as shown in FIG. 5, at time t1, due to the switching of switching device 55, at the same time that negative pressure is no longer supplied to suction nozzle 35, each of first and second opening and closing valves 63 and 64 are switched to be open. At the same time as first blow (high pressure blow) is ejected from the tip of suction nozzle 35 via first blow supply passage 61 by switching first opening and closing valve 63 to be open, second blow (low pressure blow) with a pressure lowered by regulator 65 is ejected from the tip of suction nozzle 35 via second blow supply passage 62 by switching second opening and closing valve 64 to be open.

First opening and closing valve 63 is switched to be closed at time t2 that is specified elapsed time tm after time t1 (for example, 10 msec), and by this supply of the first blow (high pressure blow) to suction nozzle 35 is stopped. Accordingly, after specified time tm from time t1 has elapsed, the second blow (low pressure blow) continues to be supplied suction nozzle 35.

In this manner, by supplying the first blow (high pressure blow) to suction nozzle 35, a vacuum break is performed rapidly with respect to the nozzle 35 that was holding the electronic component P via negative pressure, and the pressure at the tip of suction nozzle 35 (nozzle hole 35a), as shown in FIG. 5, recovers to atmospheric pressure in time TA from when the first and second opening and closing valves 63 and 64 were switched, which is a relatively short time. Accordingly, the electronic component P held by suction nozzle 35 is rapidly released. Further, after specified time tm has elapsed, only lower pressure second blow is supplied to suction nozzle 35, so the electronic component P just mounted on circuit board PB and surrounding electronic components P are not blown away.

Figure 6:
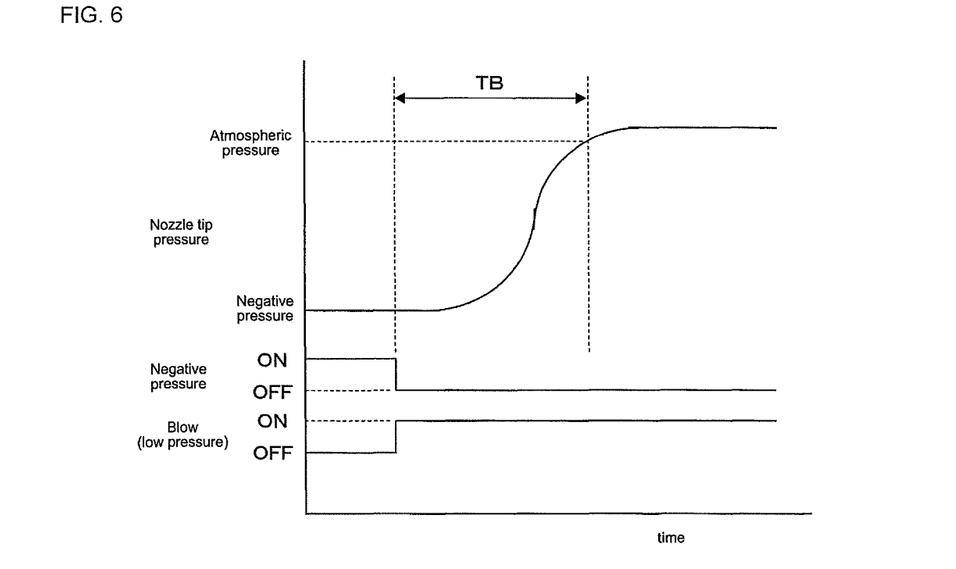
FIG. 6 provides a comparison with the pressure characteristics at the tip of the suction nozzle shown in FIG. 5.

As a comparative example to the vacuum break state of the present embodiment, FIG. 6 shows the change in pressure at the tip of suction nozzle 35 (nozzle hole 35a) when only lower pressure blow (the second blow of the present embodiment) is supplied to suction nozzle 35. In other words, when only lower pressure blow is supplied to suction nozzle 35, as shown, the time TB required to return to atmospheric pressure from when the low pressure starts to be supplied is longer than the time TA required in the present embodiment (TB>TA).

According to an embodiment above, blow supply device 58 is configured such that when positive pressure air is supplied to nozzle hole 35a of suction nozzle 35, at least a first blow is supplied to suction nozzle 35 for a specified time, then, after the specified time has elapsed, the first blow is stopped and a second blow with a lower pressure than the first blow is supplied to suction nozzle 35.

Accordingly, due to the high pressure first blow, it is possible to reliably achieve a vacuum break in a short time. Thus, an electronic component P held by suction nozzle 35 is released rapidly, meaning that electronic component mounting work efficiency is improved. Further, after the specified time has elapsed, only lower pressure second blow is supplied to suction nozzle 35, so cases of the electronic component P just mounted on circuit board PB and surrounding electronic components P being blown away are curtailed.

Also, according to an embodiment above, blow supply device 58 is configured such that supply of the second blow is started before the first blow is stopped, therefore without any delay after the vacuum break due to the first blow, supply of the second blow is continuous such that the electronic component P is released from the suction nozzle stably.

Also, according to an embodiment above, blow supply device 58 is provided with first opening and closing valve 63 provided between suction nozzle 35 and positive pressure supply source 56 and configured to supply the first blow, second opening and closing valve 64 provided between suction nozzle 35 and positive pressure supply source 56 parallel to first opening and closing valve 63 and configured to supply the second blow, and regulator 65 provided between second opening and closing valve 64 and positive pressure supply source 56 and configured to reduce the pressure supplied from positive pressure supply source 56 and supply the reduced pressure to suction nozzle 35. Thus, the pressure of the blow supplied to suction nozzle 35 is appropriately adjusted using first opening and closing valve 63 and second opening and closing valve 64.

Further, according to an embodiment above, an electronic component release method is disclosed such that when positive pressure air is supplied to nozzle hole 35*a* of suction nozzle 35, at least a first blow is supplied to suction nozzle 35 for a specified time, then, after the specified time has elapsed, the first blow is stopped and a second blow with a lower pressure than the first blow is supplied to suction nozzle 35, therefore, a release method is realized in which the vacuum break is reliably broken in a short time via the high pressure first blow.

According to an embodiment above, an example is given in which the configuration is such that supply passage 54 is connected to either of a positive pressure side or a negative pressure side via switching of switching device 55, but if switching device 55 is configured with a valve capable of switching between three positions, a positive pressure port, a negative pressure port, and a port open to the atmosphere, it would be possible to connect second blow supply passage 62 that supplies the second blow directly to the positive pressure port of switching device 55 without going via an opening and closing valve, thus enabling second opening and closing valve 64 in second blow supply passage 62 to be omitted.

Also, in an embodiment above, an example is given in which the first blow and second blow start to be supplied to suction nozzle 35 at the same time, but the supply of the second blow may be started after starting the supply of the first blow. In this case, supply of the second blow may be started before the supply of the first blow is stopped, or after the supply of the first blow is stopped.

Also, in an embodiment above, component mounting device 15 is described as holding only a single suction nozzle 35 on nozzle holding body 31 in a manner capable of being rotated and raised and lowered, but the present disclosure may be applied to a component mounting device 15 that holds multiple suction nozzles 35 on nozzle holding body 31. Also, component mounting device 15 described above is just an example of a suitable embodiment of the present disclosure, and the configuration is not limited to embodiments described above.

Further, in an embodiment described above, component supply device 13 is described as being configured from tape feeder 23 on which carrier tape is loaded in a feedable manner, the carrier tape housing multiple electronic components P in component housing sections at regular intervals, however, component supply device 13 may be configured from an item other than a tape feeder, such as a tray provided with multiple component housing sections.

In this manner, the disclosure is not limited to configuration of the embodiments described above, and various embodiments may be adopted within a scope that does not depart from the gist of the present disclosure described in the claims.

INDUSTRIAL APPLICABILITY

An electronic component mounting device and electronic component release method of the present disclosure are applicable for picking up and holding an electronic component on a suction nozzle using negative pressure, and releasing the electronic component held by the suction nozzle using positive pressure.

REFERENCE SIGNS LIST

10: electronic component mounter;
11: board conveyance device;
13: component supply device;
15: component mounting device;
20: controller;
30: mounting head;
31: nozzle holding body;
35: suction nozzle;
35*a*: nozzle hole;
55: switching device;
56: positive pressure supply source;
57: negative pressure supply source;
58: blow supply device;
63, 64: opening and closing valve;
65: regulator;
PB: circuit board;
P: electronic component

The invention claimed is:

1. An electronic component mounter comprising:
a suction nozzle configured to pick up an electronic component housed in a housing section that houses multiple of the electronic components that are to be mounted on a circuit board;
a switching device configured to switch air supplied to a nozzle hole of the suction nozzle to negative pressure air when picking up the electronic component, and to switch the air supplied to the nozzle hole of the suction nozzle to positive pressure air when mounting the electronic component that was picked up by the suction nozzle on the circuit board; and
a blow supply device configured to supply at least a first blow to the suction nozzle for a specified time when the positive pressure air is being supplied to the nozzle hole by the switching device when mounting the electronic component, then, after the specified time has elapsed, stop the first blow and supply a second blow with a lower pressure than the first blow to the suction nozzle, wherein the blow supply device includes a first opening and closing valve provided between the suction nozzle and the positive pressure supply source, and a second opening and closing valve provided between the suction nozzle and the positive pressure supply source parallel to the first opening and closing valve, wherein the first blow is supplied by opening the first opening and closing valve and by opening the second opening and closing valve, and wherein the second blow is supplied by closing the first opening and closing valve and by opening the second opening and closing valve.

2. The electronic component mounter according to claim 1, wherein the blow supply device is configured to start supplying the second blow before stopping the first blow.

3. The electronic component mounter according to claim 1, wherein the blow supply device includes:

a regulator provided between the second opening and closing valve and the positive pressure supply source and configured to reduce the pressure supplied from the positive pressure supply source and supply the reduced pressure to the suction nozzle.

4. An electronic component release method using an electronic component mounter equipped with a suction nozzle configured to pick up an electronic component housed in a housing section that houses multiple of the electronic components that are to be mounted on a circuit board, the electronic component release method comprising:

switching air supplied to a nozzle hole of the suction nozzle to negative pressure air when picking up the electronic component, and switching the air supplied to the nozzle hole of the suction nozzle to positive pressure air when mounting the electronic component that was picked up by the suction nozzle on the circuit board; and supplying at least a first blow to the suction nozzle for a specified time when the positive pressure air is being supplied to the nozzle hole when mounting the electronic component, then, after the specified time has elapsed, stopping the first blow and supplying a second blow with a lower pressure than the first blow to the suction nozzle, wherein the first blow is supplied by opening a first opening and closing valve and by opening a second opening and closing valve, and wherein the second blow is supplied by closing the first opening and closing valve and by opening the second opening and closing valve.

\* \* \* \* \*